(12) United States Patent
Nagata (10) Patent No.: US 8,956,788 B2
(45) Date of Patent: Feb. 17, 2015

(54) PELLICLE FOR LITHOGRAPHY AND A METHOD OF MAKING THEREOF

(75) Inventor: Yoshihiko Nagata, Annaka (JP)

(73) Assignee: Shin-Etsu Chemical Co., Ltd., Chiyoda-Ku, Tokyo (JP)

( * ) Notice: Subject to any disclaimer, the term of this patent is extended or adjusted under 35 U.S.C. 154(b) by 190 days.

(21) Appl. No.: 13/606,162

(22) Filed: Sep. 7, 2012

(65) Prior Publication Data

US 2013/0065164 A1 Mar. 14, 2013

(30) Foreign Application Priority Data

Sep. 9, 2011 (JP) ................................. 2011-197019

(51) Int. Cl.
*G03F 1/64* (2012.01)
*G03F 1/00* (2012.01)

(52) U.S. Cl.
CPC . *G03F 1/64* (2013.01); *G03F 1/142* (2013.01)
USPC ............................................................ 430/4

(58) Field of Classification Search
CPC .......................................................... G03F 1/64
USPC ................................................. 430/4; 355/75
See application file for complete search history.

(56) References Cited

U.S. PATENT DOCUMENTS

| 6,252,010 B1* | 6/2001 | Takeuchi et al. ............... 525/403 |
| 2003/0034125 A1* | 2/2003 | Nishimoto et al. ......... 156/307.7 |
| 2003/0096178 A1* | 5/2003 | Fujita et al. ........................ 430/5 |
| 2011/0195351 A1* | 8/2011 | Shirasaki ........................... 430/5 |

* cited by examiner

*Primary Examiner* — Stephen Rosasco
(74) *Attorney, Agent, or Firm* — Millen, White, Zelano & Branigan, P.C.

(57) ABSTRACT

A pellicle is proposed wherein the mask-bonding agglutinant layer coated on one annular face of the pellicle frame is designed to have a cross-section which is trapezoidal (including the case of rectangle) so that the angle alpha (α) included between the side wall of the agglutinant layer and said annular face is 90 degrees or smaller.

1 Claim, 6 Drawing Sheets

Relationship between upper base span and side wall angle

FIG. 5

Relationship between dispersed amount and upper base span

FIG. 6

PELLICLE FOR LITHOGRAPHY AND A METHOD OF MAKING THEREOF

The present non-provisional application claims priority, as per Paris Convention, from Japanese Patent Application No. 2011-197019 filed on Sep. 9, 2011, the disclosure of which is hereby incorporated by reference herein in its entirety.

FIELD OF THE INVENTION

This invention concerns a pellicle for lithography and relates in particular to an agglutinant for adhering the pellicle to a mask, and a shape in which the pellicle agglutinant is formed.

TECHNICAL BACKGROUND OF THE INVENTION

In manufacturing semiconductor devices such as LSI and super-LSI or in manufacturing a liquid crystal display board or the like, a pattern transferring is conducted by irradiating light to an exposure original plate such as a semiconductor wafer or an original plate for liquid crystal, but if a dust particle exists adhering to the exposure original plate, the dust particle absorbs the light or refracts it, giving rise to deformation and roughened edges to a transferred pattern and black stains to a white background, which lead to problems such as a damaged dimension, a poor quality, a deformed appearance, and lowering of the performance and the yield of the finished device.

Thus, these works are usually performed in a clean room; however, even in a clean room it is difficult to keep the exposure original plate in a dust-free state all the time; for this reason, a pellicle, which transmits the exposure light well, is attached to a surface of the exposure original plate as a dust-fender. Under such circumstances, dust does not directly adhere to the surface of the exposure original plate but only onto the pellicle membrane, and thus, in lithography operation, by setting a photo focus on the pattern formed on the exposure original plate, the dust particles on the pellicle membrane fail to cast their shadows in the image transfer performance.

Figure 1:
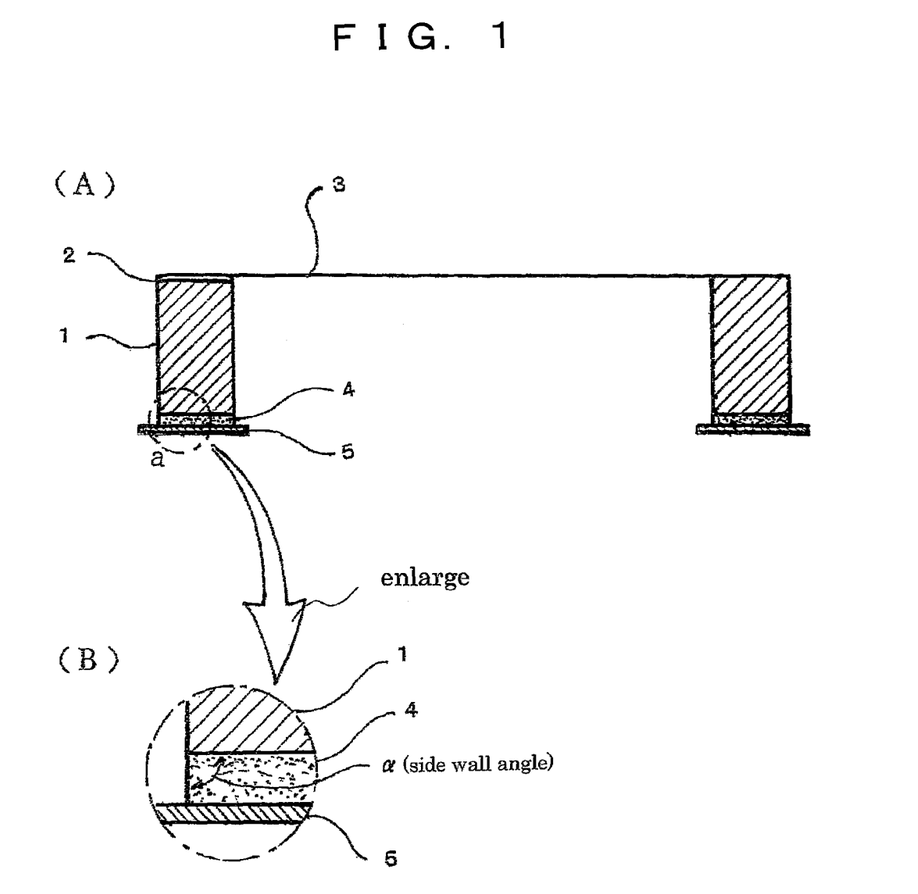
FIG. 1 is a cross sectional view of a pellicle showing a basic construction thereof.
Figure 2:
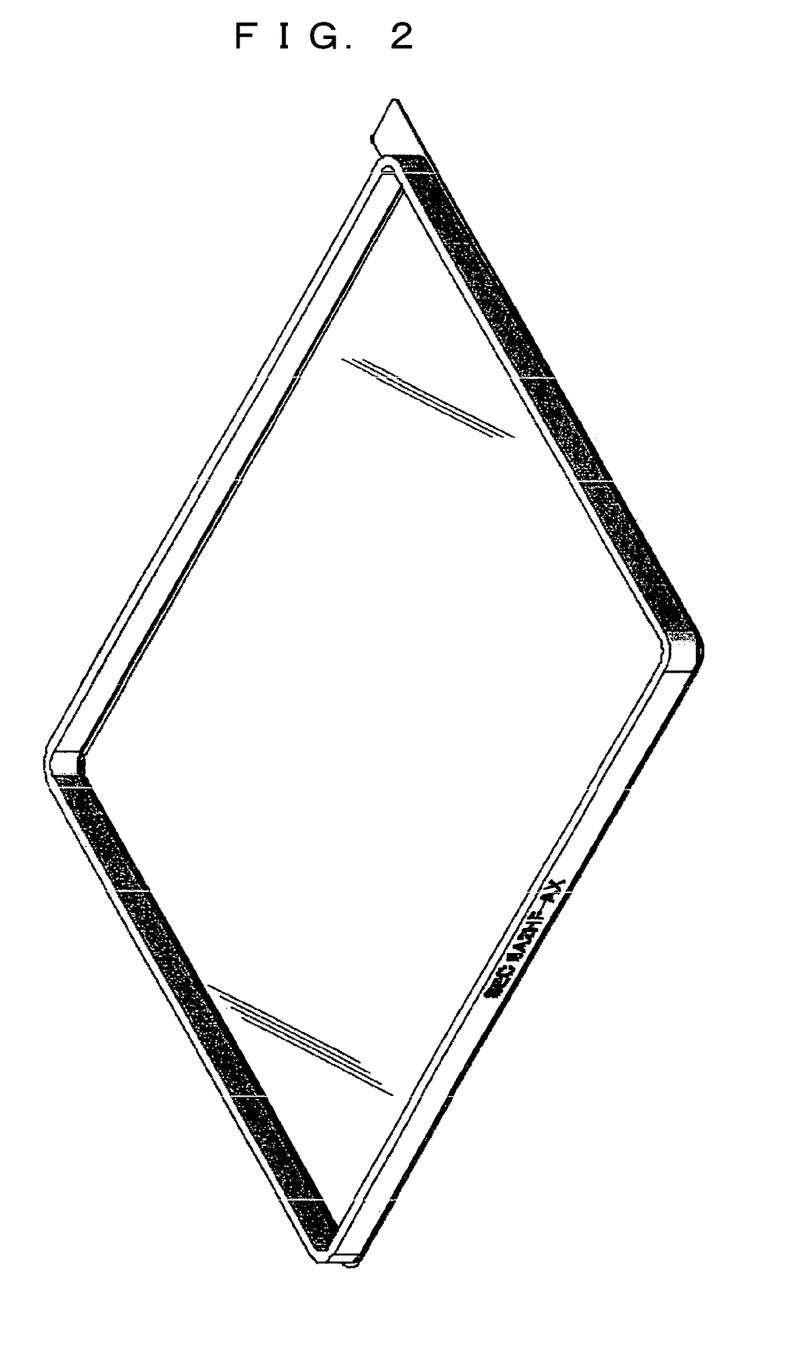
FIG. 2 is an overall perspective view of a pellicle showing a basic construction thereof.

A basic construction of a pellicle is shown in FIG. 1 and FIG. 2. A transparent pellicle membrane 3, which is made of a material that is highly transmitting to the lights used in light exposure such as cellulose nitrate, cellulose acetate and a fluorine-containing resin, is adhered to one of the two annular faces of a pellicle frame 1 (hereinafter referred to as "upper annular face"), made of an aluminum alloy such as A7075, A6061 and A5052 to which a black alumite processing has been applied, or of a pellicle frame 1 made of stainless or polyethylene or the like, or of a pellicle frame 1 of aluminum or other metal which is coated with a substance—the adhering of the transparent pellicle membrane 3 is effected by laying a solvent capable of dissolving the pellicle membrane on the upper annular face and drying the solvent by air flow (ref. IP Publication 1), or by laying an adhesive 2 such as acrylic resin, epoxy resin and fluorine-containing resin (ref. IP Publications 2 and 3); and furthermore, on the other one of the two annular faces of the pellicle frame 1 (hereinafter referred to as "lower annular face") is laid an agglutinant layer 4 made of a polybutene resin, a polyvinyl acetate resin, an acrylic resin, a silicone resin or the like; and over this agglutinant layer 4 to adhere to a photomask is laid a releasable liner 5 for protecting the agglutinant layer.

PRIOR ART PUBLICATIONS

IP Publications

[IP Publication 1] Japanese Published patent application Showa 58-219023 (1983)
[IP Publication 2] U.S. Pat. No. 4,861,402
[IP Publication 3] Japanese Examined patent application publication Showa 63-27707 (1988)

A pellicle is positioned in a manner so as to enclose the pattern region formed on the surface of the mask substrate. As the pellicle is provided for the purpose of preventing dust from sticking to the mask substrate, the pattern region is isolated from the atmosphere external to the pellicle so as to keep the dust in the external atmosphere from arriving at the pattern face. In recent years, the LSI design requirement for the resolution of lithography has progressed to sub-quarter micron orders, and in order to attain such higher resolutions the exposure light sources having shorter and shorter wavelengths have come to be adopted. That is, the heretofore most popular g-line (436 nm) and I-line (365 nm) provided by mercury lamp have been replaced by KrF excimer lasers (248 nm)], ArF excimer lasers (193 nm) and $F_2$ laser (157 nm).

However, as the wavelengths of the exposure lights are shortened, the energy carried by the exposure lights is naturally heightened. When a light of higher energy is used, the possibility that gaseous substances existing in the exposure light atmosphere are caused to react and the reaction products are deposited on the mask substrate, becomes progressively higher than in the conventional practices wherein lower energy lights are used. Therefore, counter measures have been taken, such as to decrease the amounts of the gaseous substances in clean rooms as much as possible, or to cleanse the photo masks extensively, or to replace those parts of the pellicle that create substantial amounts of gaseous substances.

In particular, as a pellicle is directly pasted to a mask substrate in use, there has been a calling for reduction of the outgases created by organic constituents of the pellicle such as agglutinant bound for mask (hereinafter simply referred to as "agglutinant"), adhesive bound for pellicle membrane (hereinafter simply referred to as "adhesive", and inner wall coating agent, and thus studies and progresses have been made to answer it. However, it has not been possible to completely do away with the so-called haze, which is a deposit on the surface of the mask substrate rendering the latter hazy, even after the photo mask is cleansed or the pellicle constituents are replaced with less outgas creating replacements—thus the haze still remains a cause for lowering of the yield in semiconductor manufacturing.

On the other hand, the area of the pattern region formed on the photomask has been increased these days, so that efforts have been made to make most effective use of the mask surface area for lithography, and as a result the position from which the exposure light is irradiated at the time of exposure is brought closer to the pellicle. Consequently, if a part of the agglutinant of the pellicle is protruding from the inner edge of the lower annular face of the pellicle at the time of light exposure, the exposure light and/or its stray light would hit upon the exposed agglutinant whereby a gas is generated, or a gas such as ozone which has been generated during the light exposure would attack the agglutinant to cause the latter to generate a gas, and as the result the performance of the agglutinant is weakened.

Even if the agglutinant is improved so as to generate less outgas, it would not help if the agglutinant is allowed to protrude from the frame to expose itself, and in some cases such a protrusion has been reported to inflict a damage upon the mask incurring a large loss.

A cause for the protrusion problem lies in that a high pressure is imposed on the pellicle as the pellicle is adhered to the photomask. The reason why such a large load is applied to the pellicle as it is adhered to the photomask via the agglutinant is that unless a sufficient load is applied there occurs an air pass between the photomask and the agglutinant whereby there arises a possibility that the isolation of the pattern face of the photomask from the outer atmosphere becomes incomplete.

When the adhesion is conducted under such a high pressure, the agglutinant layer is substantially deformed and depending on its former dimension a part of the agglutinant could be squeezed out into the central space of the pellicle frame.

SUMMARY OF THE INVENTION

Problems the Invention Seeks to Solve

In view of the above-mentioned circumstances, it is therefore an object of the present invention to propose a pellicle for lithography and its manufacturing method—a pellicle so contrived that even when a substantial pressure is imposed on the pellicle as it is being adhered to a photomask, the agglutinant is not squeezed out into the central space of the pellicle frame, by virtue of a specially designed dimension of the agglutinant layer.

Means to Solve the Problems

In order to solve the above-described problem, a pellicle for lithography according to claim 1 of the present invention comprises a pellicle membrane (3), a pellicle frame (1) over which the pellicle membrane is bonded, an adhesive layer (2) formed on an upper annular face of the pellicle frame, and an agglutinant layer (4) formed on a lower annular face of the pellicle frame; wherein the agglutinant layer (4) has a substantially rectangular or a substantially trapezoidal cross section in which the upper base (of the cross section) is parallel to the lower annular face of the pellicle frame and the legs (lateral sides) are respectively forming with the lower annular face of the pellicle frame an angle alpha equal to or smaller than 90 degrees.

Figure 3:
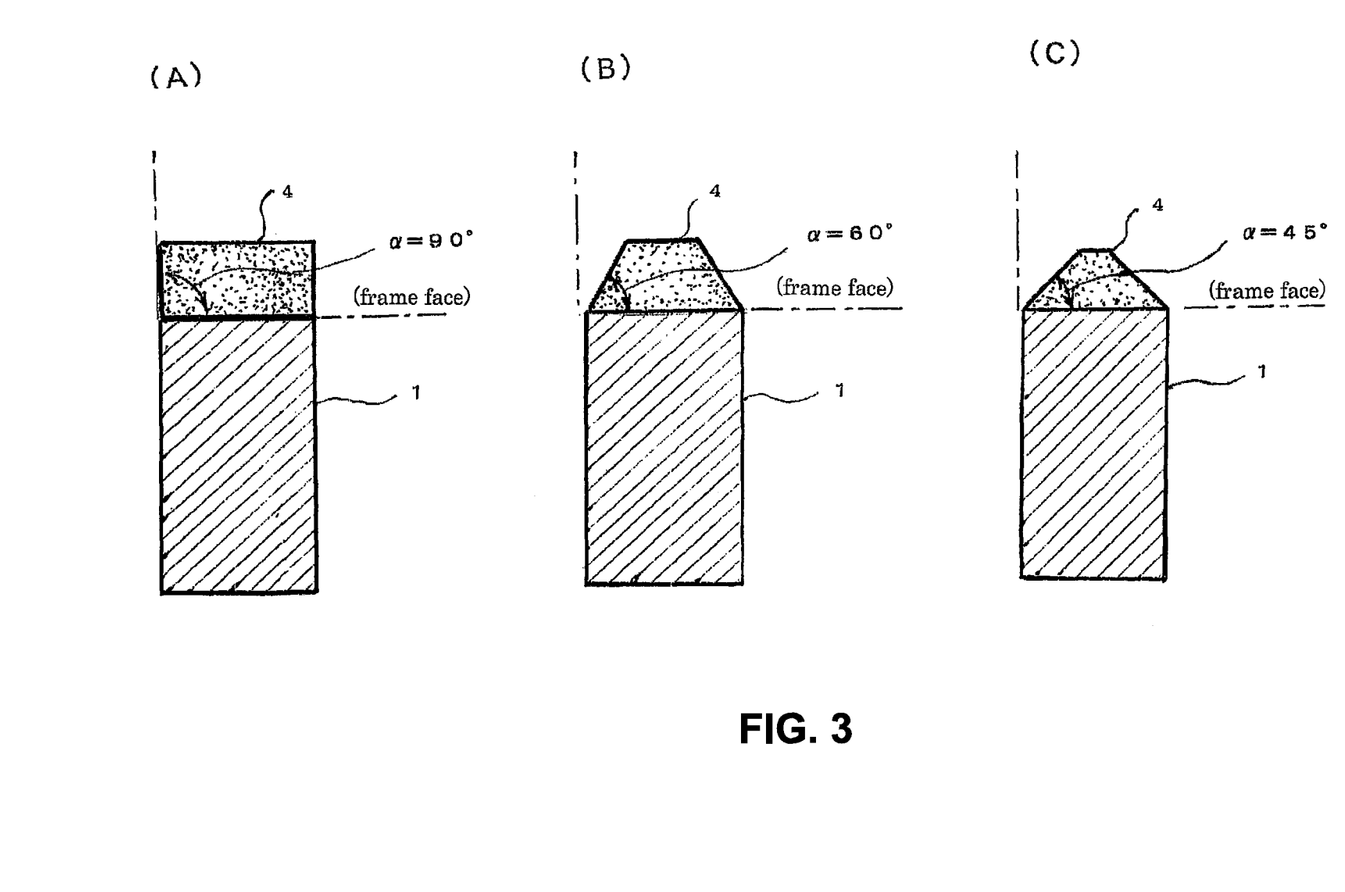
FIG. 3 is a set of schematic explanative drawings showing an angle alpha of a side wall of an agglutinant layer laid on a pellicle frame.

In the present invention the angle alpha is an angle formed between a side wall of the agglutinant layer (4) and the lower annular face of the pellicle frame and is, as shown in FIG. 3, a base angle of the trapezoidal cross-section of the agglutinant layer, and this may be simply referred to as an angle of the side wall or a side wall angle.

(We will explain how the cross-section of the agglutinant layer is shaped into a trapezoid later with reference to FIG. 6.)

In the present invention the terms rectangular and trapezoidal referring to the shape of cross sections are not to be taken to mean strictly indicating precise geometric formations but are to be taken to mean flexibly and thus include a rounded rectangular and a trapezoidal quasi-quadrilaterals.

In this part of the specification, we coupled the elements with reference numerals in parentheses for the purpose of easier linking to the drawings for the readers, but such numerals shall not be deemed to limit the scope of the meaning of each element to the respective embodiment in the drawings.

Effects of the Present Invention

The present invention proposes to restrict the angle between each side wall of the agglutinant layer and the lower annular face of the pellicle frame to 90 degrees or smaller whereby the trouble of squeezing out of the agglutinant into the central space of the pellicle frame is checked and thus only a minimized amount of agglutinant is exposed to the exposure light and/or the stray light so that less haze-creating outgas is emitted and also troubles arising from the degradation of the agglutinant layer is effectively prevented.

EMBODIMENTS TO PRACTICE THE PRESENT INVENTION

The inventor of the present invention repeated tests and found that it is possible to prevent the squeezing out of the agglutinant into the central space of the pellicle frame at the time of pressurized adhesion of the pellicle, if the formation of the agglutinant is conducted in a manner such that the angle between each side wall of the agglutinant layer and the lower annular face of the pellicle frame becomes 90 degrees or smaller, and thus completed the invention.

The gist of the present invention, therefore, is to avoid various troubles arising from the squeezing out of the agglutinant, which occurs when the pellicle is adhered to a photomask, by restricting the angle between each side wall of the agglutinant layer and the lower annular face of the pellicle frame to 90 degrees or smaller.

If the prevention of the squeezing out of the agglutinant is exclusively aimed at, it is safer to reduce the angle of the side wall as much as possible; however, the smaller the angle becomes, the lower will the adhesive strength becomes. Hence, on account of the requirement of "90 degrees or smaller" whereby the squeezing out is prevented while a sufficient adhesive strength is secured, the present invention is novel and inventive.

Hereinafter, we will explain the present invention in detail with the help of drawings.

A pellicle according to the present invention comprises, as shown in FIG. 1, a pellicle frame 1 and a pellicle membrane 3 bonded tensely on the upper annular face of the pellicle frame 1 via a membrane-bonding adhesive layer 2; and in this case, as is normally, an agglutinant layer 4 (mask-bonding adhesive) for adhesion to a photomask is formed on the lower annular face, and a releasable liner 5 is detachably attached to the lower face of the agglutinant layer 4. Now, it is preferable that the edges of the two annular faces of the pellicle frame 1 are chamfered. The dimension for the chamfering can be C:0.2 mm-C:0.4 mm.

In this invention, the sizes of these pellicle components are similar to those in the ordinary pellicles, such as ones used for semiconductor lithography, and ones used for manufacture of large-sized liquid crystal display board, and the materials to make them can be any above-mentioned ones, which are known to have been used.

In particular, there is no limitation to the kind of pellicle membrane, and examples include amorphous fluorine-containing polymers conventionally used for excimer lasers. Examples of amorphous fluorine-containing polymers include Citop (a product name of Asahi Glass Co., Ltd.), TEFLON AF (a product name of Du Pont).

At the time of manufacturing the pellicle membrane, any of these polymers may be used after being dissolved in a solvent such as fluoro-philic solvent, to an extent necessary.

The material for the pellicle frame using in the present invention can be any aluminum alloy that has been conventionally used, and JIS A7075, JIS A6061, and JIS A5052 are preferred; but materials other than aluminum alloy such as resin and glass are acceptable so long as they have a sufficient strength suitable for a pellicle frame.

It is possible to form an air vent hole (not shown) through any of four bars of the pellicle frame 4. There are no particular limitations to the size and the shape for the air vent hole, but they can be determined by the mesh size, filtration area, or the desired quantity of airflow calculated from the former two parameters, of a (dust-fending) filter which is installed in the air vent hole.

As the dust-fending filter used in the present invention, there are no particular limitations to its dimension, number or position so long as it can be installed in the air vent hole. The material of which the dust-fending filter is made can be selected from resins (including PTFE and Nylon 66), metals (including 316 L stainless steel), ceramics (including alumina and aluminum nitride) and the like.
It is also preferable that a chemical filter, which absorbs and decomposes chemical substances existing in the environment, is juxtaposed with the dust-fending filter in a position external to the dust-fending filter.

The adhesive for bonding the pellicle membrane can be any of the conventionally used ones, for example ones made of acrylic resin, epoxy resin, silicone resin, and fluorine-containing polymer like fluorine-containing silicone resin, and among these, fluorine-containing polymer adhesives are preferred.

An example of fluorine-containing polymer is fluorine-containing high-molecular polymer CTX809 (a product name of Asahi Glass Co., Ltd.).

The material to make the agglutinant for adhesion to the photomask can be silicone resin adhesive, acrylic adhesive, and a hot melt adhesive such as SEBS (polystyrene-poly(ethylene-butylene)-polystyrene), but any other adhesive will do if it has a sufficient bonding strength and does not emit outgas when exposed to exposure light.

When the agglutinant layer is applied to the lower annular face of the frame, its exposed face is molded into a flat face. A method for this is to press the agglutinant after it is applied. More particularly, a solution of agglutinant is discharged from a discharge nozzle and a bead is formed at the nozzle end, and the discharge nozzle is placed closely to the lower annular face of the frame until the bead is in touched with the face, and then the nozzle is moved along the frame. After dispensing the agglutinant evenly on the entire circuit of the frame, the agglutinant is heated if it is of thermosetting type, and while the agglutinant is half hardened the surface of the agglutinant is press-molded into a flat face.

If the agglutinant is a hot melt adhesive, then after the dispensing and hardening of the agglutinant, it is heated again and then flattened by pressure.

FIG. 3 is a schematic drawing showing the cross-sectional outlines of the agglutinant layers formed on the pellicle frames, wherein (A) shows a case in which the side wall angle (as defined in [0014]) is 90 degrees;

(B) shows a case in which the side wall angle is 60 degrees; and (C) shows a case in which the side wall angle is 45 degrees.

Incidentally, a remark is made, lest one should it understand differently, that the drawings here are upside down in comparison to the ones in FIG. 1.

It is possible to modify the side wall angle (angle included between a side wall of the agglutinant layer and the lower annular face of the frame) by changing the amount of the agglutinant applied.

Figure 4:
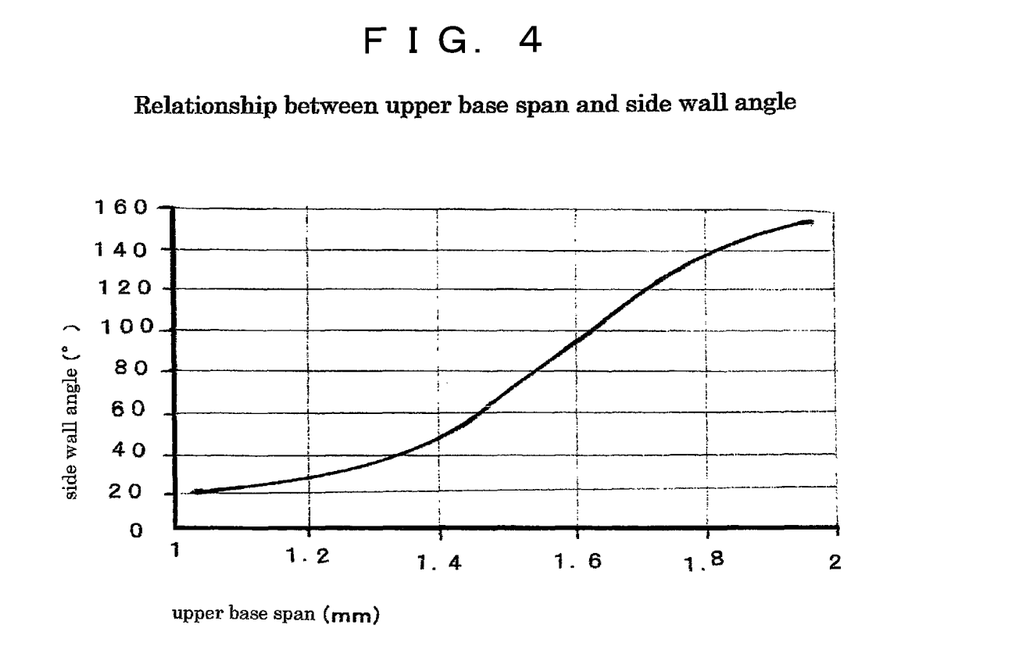
FIG. 4 is a graph to show a preferred relationship between the width of a lower annular face of the pellicle frame and the angle of a side wall of the agglutinant layer.
Figure 5:
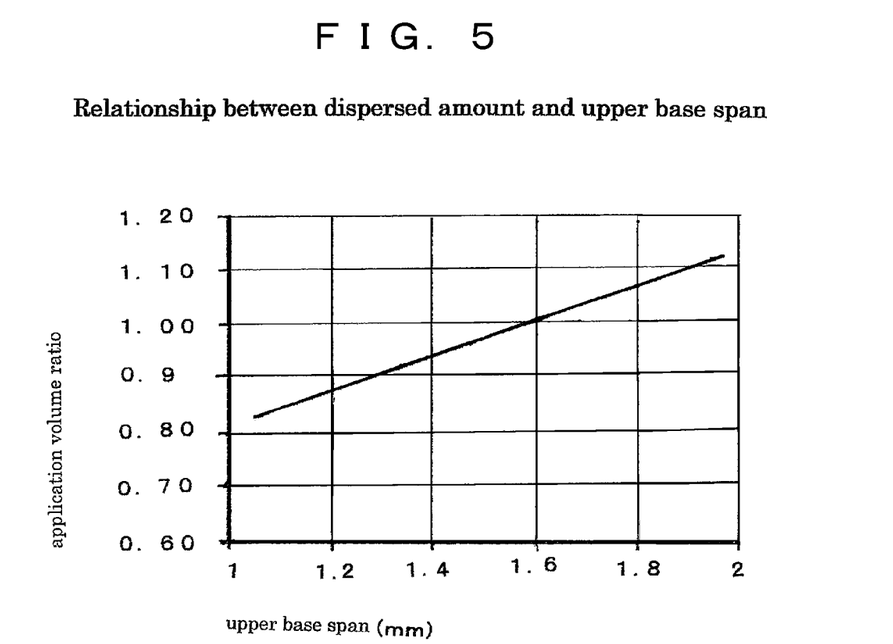
FIG. 5 is a graph to show a relationship between the width of a lower annular face of the pellicle frame and an application volume ratio (ratio of the application amount of the agglutinant to that amount at which the resultant side wall angle becomes 90 degrees.

FIG. 4 shows a relationship between the width of a lower annular face of the pellicle frame and the side wall angle, and FIG. 5 shows a relationship between the width of a lower annular face of the pellicle frame and a relative amount by which the agglutinant is applied.

Figure 6:
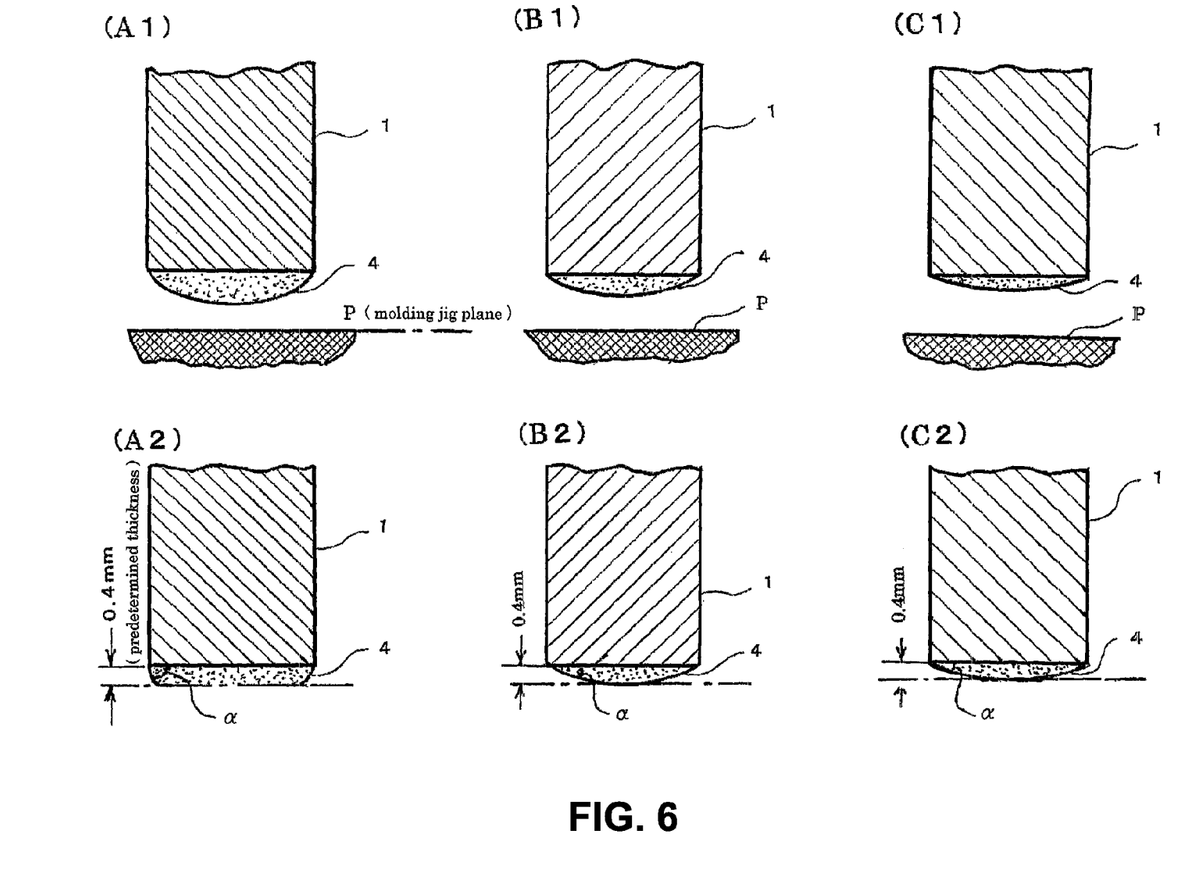
FIG. 6 is a set of schematic drawings useful to explain about the formation of agglutinant.

FIG. 6 is a set of schematic drawings to explain a relationship between the amount of agglutinant and the side wall angle alpha in formation of the agglutinant layers.

(With reference to the drawings in the top part) the lower annular faces of the pellicle frame 1 are coated with agglutinant 4.

(A1) shows a case in which the amount of the agglutinant is relatively large;

(C1) shows a case in which the amount of the agglutinant is relatively small; and (B1) shows a case in which the amount of the agglutinant is intermediate between the cases (A1) and (C1).

The thickness of the agglutinant layer is regulated to a specified value (0.4 mm in this example).

(With reference to A1) the agglutinant 4 coated on the lower annular face of the pellicle frame 1 is brought to face with a plane P of a molding jig, and the agglutinant 4 is squashed on the plane P in a regulated manner, whereby a situation of (A2) is created in which the thickness of the agglutinant 4 is regulated to 0.4 mm.

The cross-sectional outline of the thus formed agglutinant layer 4 becomes a substantial trapezoid.

The angle alpha in the drawing is the side wall angle and in the example of (A2), it is about 60 degrees.

The example of (A2) of FIG. 6 corresponds to the situation of (B) in FIG. 3.

When the amount of the agglutinant is relatively small as in (C1) of FIG. 6, the resulting formation of the agglutinant becomes like the example of (C2) wherein the side wall angle alpha is quite small;

when the amount of the agglutinant is moderate as in (B1) of FIG. 6, the resulting formation of the agglutinant becomes like the example of (B2) wherein the side wall angle alpha is moderate.

The example of (B2) nearly corresponds to the situation of (C) of FIG. 3.

The pellicle according to the present invention can be fabricated by tensely pasting a pellicle membrane on the upper annular face of the pellicle frame by means of any conventionally employed method using the membrane-bonding adhesive, and laying the photomask-bonding agglutinant layer on the lower annular face, and finally covering the exposed face of this agglutinant layer with a releaser layer (liner), which protects the agglutinant layer and is capable of smoothly detaching from the agglutinant layer. Now, the membrane-bonding adhesive layer which is laid over the upper annular face of the pellicle can be formed by first diluting a product adhesive in a solvent to an appropriate extent, if necessary, and then applying the adhesive solution to the upper annular face of the pellicle frame, followed by heating and drying it to harden. Incidentally, the adhesive can be applied in ways such as brush coating, spraying and automatic dispensing.

The choice for the material of which the releasable liner to be used in the present invention for protecting the agglutinant layer is made is not specially limited. For example, PET, PTFE, PFA, PE, PC PVC, PP and the like will do.

EXAMPLES OF THE INVENTION

Examples (four) of the present invention as well as Comparative Examples (three) will be described herein below.

In each of these seven instances, a pellicle frame of a particular specification was made and an agglutinant layer is formed on the frame; and the pellicle is adhered to a photomask of a certain specification, and an exposure light of a predetermined specification was eradiated, and thereafter an inspection was made to find foreign matters that may have been generated; the angle alpha included between the agglutinant side wall and the lower annular face is varied among these instances.

Table 1 shows important parameters of the agglutinant and the results of the inspection in the instances of four examples and three comparative examples.

Example 1

In the first place, a rectangular frame made of an aluminum alloy A7075-T651 was machined out as the pellicle frame, having the outer peripheral dimension of 149 mm×122 mm, the width of 5.8 mm, and the frame thickness, that is the distance between the upper and lower annular faces, of 2 mm; the annular faces were chamfered along their edges by C:0.2 mm. Through a middle portion of one of the side bars of the frame was made one air vent hole having a diameter of 0.5 mm.

The surface of this frame was washed, and then roughened in a sand blast machine wherein the frame was subjected to a blasting of glass beads at a blasting pressure of about 147 kPa (1.5 kg/cm$^2$) for a duration of one minute. Thereafter, the frame was dipped in a bath of NaOH treatment solution for ten seconds for washing, and then the frame was subjected to an anodic oxidation in a 14% sulfuric acid aqueous solution at a solution temperature of 18 degrees centigrade under an anodization voltage of 10V (1.3 A).

Next, the surface of the frame was subjected to a black color coating and sealing of the coating, whereby a black color oxide surface layer was formed. Thereafter, the frame was washed for five minutes with extra pure water in a ultrasonic washing machine.

Next, the inward looking faces of the pellicle frame were coated with an acrylic resin adhesive to a thickness of 10 micrometers by means of a spray coating machine.

Then, a filter made of PTFE and having a dust filtration capability of 99.9999% for dust particle sizes of 0.1 micrometer-3.0 micrometers, and having a dimension of 8 mm in width, 2.5 mm in height and 300 micrometers in thickness was installed in the air vent hole. The filter consisted of a dust-stopper filter member and a chemical filter member, the latter being juxtaposed with the former in a position external to the former.

Next, Teflon AF1600 (a Trademark of Du Pont USA) was dissolved in a fluorine-containing solvent Fluorinert FC-75 (a Trademark of 3M United States) to obtain a solution of 8% concentration.

Then this solution was laid over a mirror-polished face of a silicon base plate having a diameter of 250 mm and a thickness of 600 micrometers by means of a spin coater to form a 0.83 micrometer-thick transparent membrane.

A temporary rectangular frame having an outer peripheral dimension of 200 mm×200 mm, the width of the side bars of 5 mm, and the frame thickness of 5 mm was attached to this membrane by means of an epoxy resin adhesive ARALDITE RAPID (a Trademark of SHOWA HIGHPOLYMER CO., LTD) and the membrane was peeled off from the base plate.

Next, the lower annular face of the pellicle frame made of an aluminum alloy, which had been prepared as described above, was coated with an acrylic resin adhesive.

On this occasion, the amount of the acrylic resin adhesive (agglutinant) to be dispensed was regulated to such an amount that the resulting agglutinant layer would have a trapezoidal cross section of a predetermined thickness (height) of 0.4 mm, an upper base span of 1.4 mm, a side wall angle of 45 degrees (application volume ratio of 0.94), relying on the phenomenon that the greater the dispensed amount, the greater the side wall angle will be, and smaller the dispensed amount, the smaller the side wall angle will be.

This acrylic resin adhesive was pre-cured at 100 degrees centigrade for three minutes. This half-cured agglutinant layer was finished to have a face flatness of 10 micrometers, and a press machine having a pressure plate equipped with a releaser liner on its face was operated to press the agglutinant to flatten its convex face.

The resulting agglutinant layer had a side wall angle of 45 degrees and upper base span of 1.4 mm. (Reference is made to the row of Example 1 in Table 1.)

Then, the upper annular face of the frame made of the aluminum alloy was coated with a fluorine-containing highmolecular polymer CTX 809 (a product name of Asahi Glass Co., Ltd.) diluted with a fluorine-containing solvent CT-SOLV180 (a product name of Asahi Glass Co., Ltd.); this adhesive was dried to harden by being heated at a temperature of 100 degrees centigrade for ten minutes. Next, a releasable liner made of PET was procured and was attached to the photomask-bonding agglutinant by means of a liner application machine having a image processing position control mechanism equipped with a CCD camera.

Then, the pellicle frame was placed in contact with the film surface of the above-mentioned Teflon AF1600 membrane, which had been transferred to the temporary frame, and the pellicle frame was heated with an IR lamp whereby the pellicle frame and the membrane were firmly bonded together.

The two frames were interlocked by means of a locking device in a manner such that the membrane-bonding face of the pellicle frame faced upward and such that the positions of the frames relative to each other were made unchangeable. Next, the temporary frame outside the pellicle frame was raised and immobilized at a position whereat the tension of that portion of the membrane which extended outside the pellicle frame became about 0.5 N/m (0.5 g/cm).

Thereafter, the surplus portion of the membrane which extended beyond the pellicle frame was cut off and removed by means of a cutter attached to a SCARA robot and equipped with a tube-type dispenser, which dripped fluorine-containing solvent Fluorinert FC-75 (a Trademark of 3M United States) at a rate of 10 micro liters a minute, the cutter being moved and slitting along the external edges of the membranebonding annular face of the pellicle frame.

The thus completed pellicle was washed under a condition whereby the concentration of the surface remaining acid component became 1 ppb or lower, and it was adhered to a 6-inch photomask base plate, which was made of quartz glass and formed with a Cr test pattern.

Next, this assembly was set in an ArF excimer laser scanner NSR S306C (a product name of Nikon Corporation), and it was subjected to an irradiation of 500 J/cm$^2$ with an on-the-photomask-surface exposure strength of 0.01 mJ/cm$^2$/pulse at a repetition frequency of 4000 Hz.

A surface of the 6-inch photomask thus irradiated was inspected with a laser foreign material inspection system, and there were found no haze and foreign materials in the test pattern region and the glass region.

Example 2

In the first place, a rectangular frame made of an aluminum alloy A7075-T651 was machined out as the pellicle frame, having the outer peripheral dimension of 149 mm×122 mm, the width of 5.8 mm, and the frame thickness of 2 mm; the annular faces were chamfered along their edges by C:0.2 mm. Through a middle portion of one of the side bars of the frame was made one air vent hole having a diameter of 0.5 mm.

The surface of this frame was washed, and then roughened in a sand blast machine wherein the frame was subjected to a blasting of glass beads at a blasting pressure of about 147 kPa (1.5 kg/cm$^2$) for a duration of one minute. Thereafter, the frame was dipped in a bath of NaOH treatment solution for ten seconds for washing, and then the frame was subjected to an anodic oxidation in a 14% sulfuric acid aqueous solution at a solution temperature of 18 degrees centigrade under an anodization voltage of 10V (1.3 A).

Next, the surface of the frame was subjected to a black color coating and sealing of the coating, whereby a black color oxide surface layer was formed. Thereafter, the frame was washed for five minutes with extra pure water in a ultrasonic washing machine.

Next, the inward looking faces of the pellicle frame were coated with a silicone resin adhesive KR-3700 (a product name of Shin-Etsu Chemical Co., Ltd.) to a thickness of 10 micrometers by means of a spray coating machine.

Then, a filter made of PTFE and having a dust filtration capability of 99.9999% for dust particle sizes of 0.1 micrometer-3.0 micrometers, and having a dimension of 8 mm in width, 2.5 mm in height and 300 micrometers in thickness was installed in the air vent hole. The filter consisted of a dust-stopper filter member and a chemical filter member, the latter being juxtaposed with the former in a position external to the former.

Next, Teflon AF1600 (a Trademark of Du Pont USA) was dissolved in a fluorine-containing solvent Fluorinert FC-75 (a Trademark of 3M United States) to obtain a solution of 8% concentration.

Then this solution was laid over a mirror-polished face of a silicon base plate having a diameter of 250 mm and a thickness of 600 micrometers by means of a spin coater to form a 0.83 micrometer-thick transparent membrane.

A temporary rectangular frame having an outer peripheral dimension of 200 mm×200 mm, the width of the side bars of 5 mm, and the frame thickness of 5 mm was attached to this membrane by means of an epoxy resin adhesive ARALDITE RAPID (a Trademark of SHOWA HIGHPOLYMER CO., LTD) and the membrane was peeled off from the base plate.

Next, the lower annular face of the pellicle frame made of an aluminum alloy, which had been prepared as described above, was coated with a silicone resin adhesive KR-3700 (a product name of Shin-Etsu Chemical Co., Ltd.).

On this occasion, the amount of the acrylic resin adhesive (agglutinant) to be dispensed was regulated to such an amount that the resulting agglutinant layer would have a trapezoidal cross section of a predetermined thickness of 0.4 mm, an upper base span of 1.49 mm, a side wall angle of 60 degrees (application volume ratio of 0.96).

This acrylic resin adhesive was pre-cured at 100 degrees centigrade for three minutes. This half-cured agglutinant layer was finished to have a face flatness of 10 micrometers, and a press machine having a pressure plate equipped with a releaser liner on its face was operated to press the agglutinant to flatten its convex face.

The resulting agglutinant layer had a side wall angle of 60 degrees and upper base span of 1.49 mm.

Then, the upper annular face of the frame made of the aluminum alloy was coated with a fluorine-containing high-molecular polymer CTX809 (a product name of Asahi Glass Co., Ltd.) diluted with a fluorine-containing solvent CT-SOLV180 (a product name of Asahi Glass Co., Ltd.); this adhesive was dried to harden by being heated at a temperature of 100 degrees centigrade for ten minutes. Next, a releasable liner made of PET was procured and was attached to the photomask-bonding agglutinant by means of the liner application machine having an image processing position control mechanism equipped with a CCD camera.

Then, the pellicle frame was placed in contact with the film surface of the above-mentioned Teflon AF1600 membrane, and the pellicle frame was heated with an IR lamp whereby the pellicle frame and the membrane were firmly bonded together.

The two frames were interlocked by means of a locking device in a manner such that the membrane-bonding face of the pellicle frame faced upward and such that the positions of the frames relative to each other were made unchangeable. Next, the temporary frame outside the pellicle frame was raised and immobilized at a position whereat the tension of that portion of the membrane which extended outside the pellicle frame became about 0.5 N/m (0.5 g/cm).

Thereafter, the surplus portion of the membrane which extended beyond the pellicle frame was cut off and removed by means of a cutter attached to a SCARA robot and equipped with a tube-type dispenser, which dripped fluorine-containing solvent Fluorinert FC-75 (a Trademark of 3M United States) at a rate of 10 micro liters a minute, the cutter being moved and slitting along the external edges of the membrane-bonding annular face of the pellicle frame.

The thus completed pellicle was washed under a condition whereby the concentration of the surface remaining acid component became 1 ppb or lower, and it was adhered to a 6-inch photomask base plate, which was made of quartz glass and formed with a Cr test pattern.

Next, this assembly was set in an ArF excimer laser scanner NSR S306C (a product name of Nikon Corporation), and it was subjected to an irradiation of 500 J/cm$^2$ with an on-the-photomask-surface exposure strength of 0.01 mJ/cm$^2$/pulse at a repetition frequency of 4000 Hz.

A surface of the 6-inch photomask thus irradiated was inspected with a laser foreign material inspection system, and there were found no haze and foreign materials in the test pattern region and the glass region.

Example 3

Next, using the similar frame as in Example 2 and undergoing the same steps as in Example 2, but regulating the amount of the agglutinant dispensed to such a value that the resultant agglutinant layer would have a trapezoidal cross section of a thickness of 0.4 mm, an upper base span of 1.55 mm, a side wall angle of 75 degrees (application volume ratio of 0.98), the resultant side wall angle of the agglutinant layer formed was 76 degrees.

The difference between the aimed angle of 75 degrees and the resultant angle of 76 degrees was considered acceptable for the purpose of the experiment, so that the experiment was continued.

Next, the photomask/pellicle assembly was set in an ArF excimer laser scanner NSR S306C (a product name of Nikon Corporation), and it was subjected to an irradiation of 500 J/cm$^2$ with an on-the-photomask-surface exposure strength of 0.01 mJ/cm$^2$/pulse at a repetition frequency of 4000 Hz.

A surface of the 6-inch photomask thus irradiated was inspected with a laser foreign material inspection system, and there were found no haze and foreign materials in the test pattern region and the glass region.

Example 4

In order to ascertain the maximum allowability of side wall angle of 90 degrees in the present invention, an examination was conducted wherein a similar frame as in Example 3 was used and similar steps as in Example 3 were taken, but the amount of the agglutinant dispensed was regulated to such a value that the resultant agglutinant layer would have a trapezoidal cross section of a thickness of 0.4 mm, an upper base span of 1 mm, a side wall angle of 90 degrees (application volume ratio of 1.0).

Next, the photomask/pellicle assembly was set in an ArF excimer laser scanner NSR S306C (a product name of Nikon Corporation), and it was subjected to an irradiation of 500 J/cm$^2$ with an on-the-photomask-surface exposure strength of 0.01 mJ/cm$^2$/pulse at a repetition frequency of 4000 Hz.

A surface of the 6-inch photomask thus irradiated was inspected with a laser foreign material inspection system, and there were found no haze and foreign materials in the test pattern region and the glass region.

In order to ascertain the maximum allowability of the side wall angle of 90 degrees in the present invention, the foregoing examples were arranged such that the side wall angle approached 90 degrees from 45 degrees.

In the following comparative examples, the side wall angle of 90 degrees was approached from a larger angle of 135 degrees.

Comparative Example 3

In the first place, a rectangular frame made of an aluminum alloy A7075-T651 was machined out as the pellicle frame, having the outer peripheral dimension of 149 mm×122 mm, the width of 5.8 mm, and the frame thickness of 2 mm; the annular faces were chamfered along their edges by C:0.2 mm. Through a middle portion of one of the side bars of the frame was made one air vent hole having a diameter of 0.5 mm.

The surface of this frame was washed, and then roughened in a sand blast machine wherein the frame was subjected to a blasting of glass beads at a blasting pressure of about 147 kPa (1.5 kg/cm$^2$) for a duration of one minute. Thereafter, the frame was dipped in a bath of NaOH treatment solution for ten seconds for washing, and then the frame was subjected to an anodic oxidation in a 14% sulfuric acid aqueous solution at a solution temperature of 18 degrees centigrade under an anodization voltage of 10V (1.3 A).

Next, the surface of the frame was subjected to a black color coating and sealing of the coating, whereby a black color oxide surface layer was formed. Thereafter, the frame was washed for five minutes with extra pure water in a ultrasonic washing machine.

Next, the inward looking faces of the pellicle frame were coated with a silicone resin adhesive KR-3700 (a product name of Shin-Etsu Chemical Co., Ltd.) to a thickness of 10 micrometers by means of a spray coating machine.

Then, a filter made of PTFE and having a dust filtration capability of 99.9999% for dust particle sizes of 0.1 micrometer-3.0 micrometers, and having a dimension of 8 mm in width, 2.5 mm in height and 300 micrometers in thickness was installed in the air vent hole. The filter consisted of a dust-stopper filter member and a chemical filter member, the latter being juxtaposed with the former in a position external to the former.

Next, Teflon AF1600 (a Trademark of Du Pont USA) was dissolved in a fluorine-containing solvent Fluorinert FC-75 (a Trademark of 3M United States) to obtain a solution of 8% concentration.

Then this solution was laid over a mirror-polished face of a silicon base plate having a diameter of 250 mm and a thickness of 600 micrometers by means of a spin coater to form a 0.83 micrometer-thick transparent membrane.

A temporary rectangular frame having an outer peripheral dimension of 200 mm×200 mm, the width of the side bars of 5 mm, and the frame thickness of 5 mm was attached to this membrane by means of an epoxy resin adhesive ARALDITE RAPID (a Trademark of SHOWA HIGHPOLYMER CO., LTD) and the membrane was peeled off from the base plate.

Next, the lower annular face of the pellicle frame made of an aluminum alloy, which had been prepared as described above, was coated with an acrylic resin adhesive. The amount of the acrylic resin adhesive dispensed was regulated to such an amount that the resulting agglutinant layer would have a trapezoidal cross section of a thickness (height) of 0.4 mm, an upper base span of 1.4 mm, a side wall angle of 45 degrees (application volume ratio of 0.94), relying on the phenomenon that the greater the dispensed amount, the greater the side wall angle will be, and smaller the dispensed amount, the smaller the side wall angle will be.

On this occasion, the amount of the acrylic resin adhesive (agglutinant) to be dispensed was regulated to such an amount that the resulting agglutinant layer would have a trapezoidal cross section of an upper base span of 1.8 mm, a side wall angle of 135 degrees (application volume ratio of 1.06).

This acrylic resin adhesive was pre-cured at 100 degrees centigrade for three minutes. This half-cured agglutinant layer was finished to have a face flatness of 10 micrometers, and a press machine having a pressure plate equipped with a releaser liner on its face was operated to press the agglutinant to flatten its convex face.

The resulting agglutinant layer had a side wall angle of 135 degrees and upper base span of 1.8 mm.

Then, the upper annular face of the frame made of the aluminum alloy was coated with a fluorine-containing high-molecular polymer CTX (a product name of Asahi Glass Co., Ltd.) diluted with a fluorine-containing solvent CT-SOLV180 (a product name of Asahi Glass Co., Ltd.); this adhesive was dried to harden by being heated at a temperature of 100 degrees centigrade for ten minutes. Next, a releasable liner made of PET was procured and was attached to the photomask-bonding agglutinant by means of a liner application machine having a image processing position control mechanism equipped with a CCD camera.

Then, the pellicle frame was placed in contact with the film surface of the above-mentioned Teflon AF1600 membrane, which had been transferred to the temporary frame, and the pellicle frame was heated with an IR lamp whereby the pellicle frame and the membrane were firmly bonded together.

The two frames were interlocked by means of a locking device in a manner such that the membrane-bonding face of the pellicle frame faced upward and such that the positions of the frames relative to each other were made unchangeable. Next, the temporary frame outside the pellicle frame was raised and immobilized at a position whereat the tension of that portion of the membrane which extended outside the pellicle frame became about 0.5 N/m (0.5 g/cm).

Thereafter, the surplus portion of the membrane which extended beyond the pellicle frame was cut off and removed by means of a cutter attached to a SCARA robot and equipped with a tube-type dispenser, which dripped fluorine-containing solvent Fluorinert FC-75 (a Trademark of 3M United States) at a rate of 10 micro liters a minute, the cutter being moved and slitting along the external edges of the membrane-bonding annular face of the pellicle frame.

The thus completed pellicle was washed under a condition whereby the concentration of the surface remaining acid component became 1 ppb or lower, and it was adhered to a 6-inch photomask base plate, which was made of quartz glass and formed with a Cr test pattern.

Next, this assembly was set in an ArF excimer laser scanner NSR S306C (a product name of Nikon Corporation), and it was subjected to an irradiation of 500 J/cm$^2$ with an on-the-photomask-surface exposure strength of 0.01 mJ/cm$^2$/pulse at a repetition frequency of 4000 Hz.

A surface of the 6-inch photomask thus irradiated was inspected with a laser foreign material inspection system, and there were observed no haze and foreign materials in the middle part of the test pattern region, but haze was observed in the peripheral part of the pattern region along the pellicle frame. This haze was analyzed with a laser Raman spectroscopy analyzer and was found to be a hydrocarbon-based compound. This hydrocarbon-based compound is thought to be produced as the acrylic resin adhesive was decomposed.

Comparative Example 2

In the first place, a rectangular frame made of an aluminum alloy A7075-T651 was machined out as the pellicle frame, having the outer peripheral dimension of 149 mm×122 mm, the width of 5.8 mm, and the frame thickness of 2 mm; the annular faces were chamfered along their edges by C:0.2 mm. Through a middle portion of one of the side bars of the frame was made one air vent hole having a diameter of 0.5 mm.

The surface of this frame was washed, and then roughened in a sand blast machine wherein the frame was subjected to a blasting of glass beads at a blasting pressure of about 147 kPa (1.5 kg/cm$^2$) for a duration of one minute. Thereafter, the frame was dipped in a bath of NaOH treatment solution for ten seconds for washing, and then the frame was subjected to an anodic oxidation in a 14% sulfuric acid aqueous solution at a solution temperature of 18 degrees centigrade under an anodization voltage of 10V (1.3 A).

Next, the surface of the frame was subjected to a black color coating and sealing of the coating, whereby a black color oxide surface layer was formed. Thereafter, the frame was washed for five minutes with extra pure water in a ultrasonic washing machine.

Next, the inward looking faces of the pellicle frame were coated with a silicone resin adhesive KR-3700 (a product name of Shin-Etsu Chemical Co., Ltd.) to a thickness of 10 micrometers by means of a spray coating machine.

Then, a filter made of PTFE and having a dust filtration capability of 99.9999% for dust particle sizes of 0.1 micrometer-3.0 micrometers, and having a dimension of 8 mm in width, 2.5 mm in height and 300 micrometers in thickness was installed in the air vent hole. The filter consisted of a dust-stopper filter member and a chemical filter member, the latter being juxtaposed with the former in a position external to the former.

Next, Teflon AF1600 (a Trademark of Du Pont USA) was dissolved in a fluorine-containing solvent Fluorinert FC-75 (a Trademark of 3M United States) to obtain a solution of 8% concentration.

Then this solution was laid over a mirror-polished face of a silicon base plate having a diameter of 250 mm and a thickness of 600 micrometers by means of a spin coater to form a 0.83 micrometer-thick transparent membrane.

A temporary rectangular frame having an outer peripheral dimension of 200 mm×200 mm, the width of the side bars of 5 mm, and the frame thickness of 5 mm was attached to this membrane by means of an epoxy resin adhesive ARALDITE RAPID (a Trademark of SHOWA HIGHPOLYMER CO., LTD) and the membrane was peeled off from the base plate.

Next, the lower annular face of the pellicle frame made of an aluminum alloy, which had been prepared as described above, was coated with an acrylic resin adhesive.

On this occasion, the amount of the acrylic resin adhesive (agglutinant) to be dispensed was regulated to such an amount that the resulting agglutinant layer would have a trapezoidal cross section of a thickness of 0.4 mm, an upper base span of 1.72 mm, a side wall angle of 120 degrees (application volume ratio of 1.04).

This acrylic resin adhesive was pre-cured at 100 degrees centigrade for three minutes. This half-cured agglutinant layer was finished to have a face flatness of 10 micrometers, and a press machine having a pressure plate equipped with a releaser liner on its face was operated to press the agglutinant to flatten its convex face.

The resulting agglutinant layer had a side wall angle of 121 degrees and upper base span of 1.72 mm.

The difference between the aimed angle of 120 degrees and the resultant angle of 121 degrees was considered acceptable for the purpose of the experiment, so that the experiment was continued.

Then, the upper annular face of the frame made of the aluminum alloy was coated with a fluorine-containing high-molecular polymer CTX 809 (a product name of Asahi Glass Co., Ltd.) diluted with a fluorine-containing solvent CT-SOLV180 (a product name of Asahi Glass Co., Ltd.); this adhesive was dried to harden by being heated at a temperature of 100 degrees centigrade for ten minutes. Next, a releasable liner made of PET was procured and was attached to the photomask-bonding agglutinant by means of a liner application machine having a image processing position control mechanism equipped with a CCD camera.

Then, the pellicle frame was placed in contact with the film surface of the above-mentioned Teflon AF1600 membrane, which had been transferred to the temporary frame, and the pellicle frame was heated with an IR lamp whereby the pellicle frame and the membrane were firmly bonded together.

The two frames were interlocked by means of a locking device in a manner such that the membrane-bonding face of the pellicle frame faced upward and such that the positions of the frames relative to each other were made unchangeable. Next, the temporary frame outside the pellicle frame was raised and immobilized at a position whereat the tension of that portion of the membrane which extended outside the pellicle frame became about 0.5 N/m (0.5 g/cm).

Thereafter, the surplus portion of the membrane which extended beyond the pellicle frame was cut off and removed by means of a cutter attached to a SCARA robot and equipped with a tube-type dispenser, which dripped fluorine-containing solvent Fluorinert FC-75 (a Trademark of 3M United States) at a rate of 10 micro liters a minute, the cutter being moved and slitting along the external edges of the membrane-bonding annular face of the pellicle frame.

The thus completed pellicle was washed under a condition whereby the concentration of the surface remaining acid component became 1 ppb or lower, and it was adhered to a 6-inch photomask base plate, which was made of quartz glass and formed with a Cr test pattern.

Next, this assembly was set in an ArF excimer laser scanner NSR S306C (a product name of Nikon Corporation), and it was subjected to an irradiation of 500 J/cm$^2$ with an on-the-photomask-surface exposure strength of 0.01 mJ/cm$^2$/pulse at a repetition frequency of 4000 Hz.

A surface of the 6-inch photomask thus irradiated was inspected with a laser foreign material inspection system, and there were observed no haze and foreign materials in the middle part of the test pattern region, but haze was observed in the peripheral part of the pattern region along the pellicle frame. This haze was analyzed with a laser Raman spectroscopy analyzer and was found to be a hydrocarbon-based compound. This hydrocarbon-based compound is thought to be produced as the acrylic resin adhesive was decomposed.

From the above experiments, it was found that haze is produced when the side wall angles of the agglutinant layer were 135 degrees and 121 degrees.

In order to examine the situation when the side wall angle was approximated to the proposed limit of 90 degrees, Comparative Example 1 was carried out.

Comparative Example 1

In the first place, a rectangular frame made of an aluminum alloy A7075-T651 was machined out as the pellicle frame, having the outer peripheral dimension of 149 mm×122 mm, the width of 5.8 mm, and the frame thickness of 2 mm; the annular faces were chamfered along their edges by C:0.2 mm. Through a middle portion of one of the side bars of the frame was made one air vent hole having a diameter of 0.5 mm.

The surface of this frame was washed, and then roughened in a sand blast machine wherein the frame was subjected to a blasting of glass beads at a blasting pressure of about 147 kPa (1.5 kg/cm$^2$) for a duration of one minute. Thereafter, the frame was dipped in a bath of NaOH treatment solution for ten seconds for washing, and then the frame was subjected to an anodic oxidation in a 14% sulfuric acid aqueous solution at a solution temperature of 18 degrees centigrade under an anodization voltage of 10V (1.3 A).

Next, the surface of the frame was subjected to a black color coating and sealing of the coating, whereby a black color oxide surface layer was formed. Thereafter, the frame was washed for five minutes with extra pure water in a ultrasonic washing machine.

Next, the inward looking faces of the pellicle frame were coated with a silicone resin adhesive KR-3700 (a product name of Shin-Etsu Chemical Co., Ltd.) to a thickness of 10 micrometers by means of a spray coating machine.

Then, a filter made of PTFE and having a dust filtration capability of 99.9999% for dust particle sizes of 0.1 micrometer-3.0 micrometers, and having a dimension of 8 mm in width, 2.5 mm in height and 300 micrometers in thickness was installed in the air vent hole. The filter consisted of a dust-stopper filter member and a chemical filter member, the latter being juxtaposed with the former in a position external to the former.

Next, Teflon AF1600 (a Trademark of Du Pont USA) was dissolved in a fluorine-containing solvent Fluorinert FC-75 (a Trademark of 3M United States) to obtain a solution of 8% concentration.

Then this solution was laid over a mirror-polished face of a silicon base plate having a diameter of 250 mm and a thickness of 600 micrometers by means of a spin coater to form a 0.83 micrometer-thick transparent membrane.

A temporary rectangular frame having an outer peripheral dimension of 200 mm×200 mm, the width of the side bars of 5 mm, and the frame thickness of 5 mm was attached to this membrane by means of an epoxy resin adhesive ARALDITE RAPID (a Trademark of SHOWA HIGHPOLYMER CO., LTD) and the membrane was peeled off from the base plate.

Next, the lower annular face of the pellicle frame made of an aluminum alloy, which had been prepared as described above, was coated with an acrylic resin adhesive.

On this occasion, the amount of the acrylic resin adhesive (agglutinant) to be dispensed was regulated to such an amount that the resulting agglutinant layer would have a trapezoidal cross section of a thickness (height) of 0.4 mm, an upper base span of 1.7 mm, a side wall angle of 110 degrees (application volume ratio of 1.02).

This acrylic resin adhesive was pre-cured at 100 degrees centigrade for three minutes. This half-cured agglutinant layer was finished to have a face flatness of 10 micrometers, and a press machine having a pressure plate equipped with a releaser liner on its face was operated to press the agglutinant to flatten its convex face.

The resulting agglutinant layer had a side wall angle of 107 degrees and upper base span of 1.66 mm.

Then, the upper annular face of the frame made of the aluminum alloy was coated with a fluorine-containing high-molecular polymer CTX 809 (a product name of Asahi Glass Co., Ltd.) diluted with a fluorine-containing solvent CT-SOLV180 (a product name of Asahi Glass Co., Ltd.); this adhesive was dried to harden by being heated at a temperature of 100 degrees centigrade for ten minutes. Next, a releasable liner made of PET was procured and was attached to the photomask-bonding agglutinant by means of a liner application machine having an image processing position control mechanism equipped with a CCD camera.

Then, the pellicle frame was placed in contact with the film surface of the above-mentioned Teflon AF1600 membrane, which had been transferred to the temporary frame, and the pellicle frame was heated with an IR lamp whereby the pellicle frame and the membrane were firmly bonded together.

The two frames were interlocked by means of a locking device in a manner such that the membrane-bonding face of the pellicle frame faced upward and such that the positions of the frames relative to each other were made unchangeable. Next, the temporary frame outside the pellicle frame was raised and immobilized at a position whereat the tension of that portion of the membrane which extended outside the pellicle frame became about 0.5 N/m (0.5 g/cm).

Thereafter, the surplus portion of the membrane which extended beyond the pellicle frame was cut off and removed by means of a cutter attached to a SCARA robot and equipped with a tube-type dispenser, which dripped fluorine-containing solvent Fluorinert FC-75 (a Trademark of 3M United States) at a rate of 10 micro liters a minute, the cutter being moved and slitting along the external edges of the membrane-bonding annular face of the pellicle frame.

The thus completed pellicle was washed under a condition whereby the concentration of the surface remaining acid component became 1 ppb or lower, and it was adhered to a 6-inch photomask base plate, which was made of quartz glass and formed with a Cr test pattern.

Next, this assembly was set in an ArF excimer laser scanner NSR S306C (a product name of Nikon Corporation), and it was subjected to an irradiation of 500 J/cm$^2$ with an on-the-photomask-surface exposure strength of 0.01 mJ/cm$^2$/pulse at a repetition frequency of 4000 Hz.

A surface of the 6-inch photomask thus irradiated was inspected with a laser foreign material inspection system, and there were observed no haze and foreign materials in the middle part of the test pattern region, but haze was observed in the peripheral part of the pattern region along the pellicle frame. This haze was analyzed with a laser Raman spectroscopy analyzer and was found to be a hydrocarbon-based compound. This hydrocarbon-based compound is thought to be produced as the acrylic resin adhesive was decomposed.

TABLE 1

|  | application volume ratio | upper base span (mm) | side wall angle (°) | squeezing out of agglutinant | occurrence of haze |
| --- | --- | --- | --- | --- | --- |
| Example 1 | 0.94 | 1.40 | 45 | no | no |
| Example 2 | 0.96 | 1.49 | 60 | no | no |
| Example 3 | 0.98 | 1.55 | 76 | no | no |
| Example 4 | 1.0 | 1.60 | 90 | no | no |
| Comparative Example 1 | 1.02 | 1.66 | 107 | yes | yes |
| Comparative Example 2 | 1.04 | 1.72 | 121 | yes | yes |
| Comparative Example 3 | 1.06 | 1.80 | 135 | yes | yes |

EXPLANATION OF REFERENCE NUMERALS

1: pellicle frame
2: pellicle membrane-bonding adhesive layer
3: pellicle membrane
4: photomask-bonding agglutinant layer
5: liner (for protecting the agglutinant layer)

What is claimed is:

1. A method for manufacturing a pellicle for lithography, comprising:

bonding a pellicle membrane over a pellicle frame, forming an adhesive layer on an upper annular face of the pellicle frame, forming agglutinant layer on a lower annular face of the pellicle frame, wherein the agglutinant layer is substantially rectangular or substantially trapezoidal in cross section, wherein an upper base of the cross section is parallel to the lower annular face of the pellicle frame and wherein lateral sides of the cross section and the lower annular face of the pellicle frame form an angle alpha less than or equal to 90 degrees, and half-curing and then shaping the agglutinant layer into a flat layer by pressure wherein the agglutinant layer is made of a thermosetting agglutinant, attaching a releasable liner to the agglutinant layer, and curing the agglutinant layer and simultaneously bonding the pellicle membrane over the pellicle frame.

* * * * *